(12) United States Patent
Guo et al.

(10) Patent No.: US 11,916,158 B2
(45) Date of Patent: Feb. 27, 2024

(54) PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Zhiqiu Guo, Zhejiang (CN); Wenjun Gu, Zhejiang (CN); Dengzhou Yan, Zhejiang (CN); Haiyun Liu, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/742,951

(22) Filed: May 12, 2022

(65) Prior Publication Data

US 2023/0335657 A1 Oct. 19, 2023

(30) Foreign Application Priority Data

Apr. 14, 2022 (CN) .......................... 202210391099.7

(51) Int. Cl.
*H01L 31/048* (2014.01)
*H01L 31/0236* (2006.01)

(52) U.S. Cl.
CPC ...... *H01L 31/048* (2013.01); *H01L 31/02366* (2013.01)

(58) Field of Classification Search
CPC ............... H01L 31/0547; H01L 31/056; H01L 31/02327; H01L 31/02366; H01L 31/0236; H01L 31/054; H01L 31/048; H02S 40/22
See application file for complete search history.

(56) References Cited

U.S. PATENT DOCUMENTS

2011/0186114 A1* 8/2011 Homma ................. B32B 15/20
 136/252
2012/0168076 A1 7/2012 Suga et al.

FOREIGN PATENT DOCUMENTS

| CN | 102487094 | 6/2012 | |
| CN | 109301015 | 2/2019 | |
| CN | 209232801 | 8/2019 | |
| CN | 215869423 | 2/2022 | |
| CN | 114270539 | 4/2022 | |
| DE | 102013220802 A1 * | 4/2015 | ............ H02S 40/22 |
| JP | 2011108725 A * | 6/2011 | |
| JP | 2016-201516 | 12/2016 | |

(Continued)

OTHER PUBLICATIONS

Miyamoto, JP-2011108725-A, Machine Translation (Year: 2011).*

(Continued)

*Primary Examiner* — Devina Pillay
(74) *Attorney, Agent, or Firm* — NIXON PEABODY LLP; Jeffrey L. Costellia

(57) ABSTRACT

Provided is a photovoltaic module, including: a plurality of solar cell strings arranged at intervals and each including a front surface and a rear surface arranged opposite to each other; a first encapsulation adhesive film and a back panel located on the rear surface of the solar cell string; and first embossing structures provided on one side of the back panel away from the first encapsulation adhesive film. An angle α between a side surface of the first embossing structure and a plane of the back panel is in a range from 42° to 80°.

5 Claims, 6 Drawing Sheets

(56) References Cited

FOREIGN PATENT DOCUMENTS

WO    WO-2021/032489    2/2021

OTHER PUBLICATIONS

Ramsteinger, DE-102013220802-A1, Machine Translation (Year: 2015).*
Chinese Office Action (Application No. 2022103910997) dated Apr. 14, 2023.
Extended European Search Report for App. No. 22173807.3, dated Nov. 7, 2022 (9 pages).

* cited by examiner

PHOTOVOLTAIC MODULE

CROSS-REFERENCE TO RELATED APPLICATIONS

The present application claims priority to Chinese Patent Application No. 202210391099.7, filed on Apr. 14, 2022, the content of which is incorporated herein by reference in its entirety.

TECHNICAL FIELD

The present disclosure relates to the technical field of solar photovoltaic modules and, in particular, to a photovoltaic module.

BACKGROUND

A solar cell module (also called a solar panel) is a core part of a solar power generation system and is the most important part of the solar power generation system. The solar cell module serves as converting solar energy into electric energy, or sending solar energy into storage batteries for storage or driving a load to operate. The structure of the solar cell module sequentially includes from top to bottom a front panel, a front encapsulation adhesive film, a solar cell, a back encapsulation adhesive film, and a back panel. Generally, the front panel is made of transparent glass. The back panel may be transparent glass or an opaque back plate. The glass is located in the outermost layer of a photovoltaic module and is exposed to direct sunlight in an outdoor environment. On the one hand, good physical properties of the transparent glass provide good mechanical properties for the photovoltaic module. On the other hand, light energy is provided for the solar cell by utilizing high light transmittance of the glass.

In the related art, rolled glass is generally used as a part of the photovoltaic module and has light transmittance up to 90% to 92%. The light transmittance may reach 94% by means of, for example, coating. However, during utilization, the photovoltaic module has a certain gap, so that a part of the sunlight is directly transmitted through the gap and cannot shine on the photovoltaic module, resulting in a great waste. Moreover, another part of the light may be directly reflected to the ground and cannot be utilized, leading to low power efficiency of the photovoltaic module.

SUMMARY

In order to overcome the above defects, the present disclosure provides a photovoltaic module, which enables light transmitted through a gap of the photovoltaic module to be reflected to a rear surface of the photovoltaic module and to be absorbed, and can also increase the utilization rate of the light reflected by the ground, so as to improve the power of the photovoltaic module.

According to some embodiments of the present disclosure, a photovoltaic module is provided, including: a plurality of solar cell strings arranged at intervals and each including a front surface and a rear surface arranged opposite to each other; a first encapsulation adhesive film and a back panel located on the rear surface of the solar cell string; and first embossing structures provided on one side of the back panel away from the first encapsulation adhesive film. An angle α between a side surface of the first embossing structure and a plane of the back panel is in a range from 420 to 80°.

According to some embodiments of the present disclosure, a back panel is provided, including: first embossing structures provided on one side of the back panel. An angle α between a side surface of the first embossing structure and a plane of the back panel is in a range from 42° to 80°.

According to the present disclosure, the first embossing structures are arranged on one side (i.e., air side) of the back panel away from the first encapsulation adhesive film, and an angle α between a side surface of the first embossing structure and a plane of the back panel ranges from 42° to 80°. During light irradiation, with the arrangement of the first embossing structures at a certain angle, sunlight is incident from a gap of the photovoltaic module, and the incident sunlight can be reflected to the rear surface of the photovoltaic module after passing through the first embossing structure, so that the light transmitted through the gap can be effectively utilized. At the same time, part of the sunlight is directly incident to the ground, and sunlight reflected by the ground can also be reflected to the solar cell string through the first embossing structure, thereby improving the power of the photovoltaic module.

Other features and advantages of embodiments of the present disclosure will be set forth in the specification which follows and in part will become apparent from the specification or may be learned from practice of the embodiments of the present disclosure. The objectives and other advantages of the present disclosure may be realized and attained by the structure particularly pointed out in the specification and the accompanying drawings.

BRIEF DESCRIPTION OF DRAWINGS

In order to better illustrate the technical solutions in embodiments of the present disclosure, the accompanying drawings used in the description of the embodiments will be introduced below. It is apparent that, the accompanying drawings in the following description are only some embodiments of the present disclosure, and other drawings can be obtained by those of ordinary skill in the art from the provided drawings without creative efforts.

REFERENCE SIGNS

Figure 1:
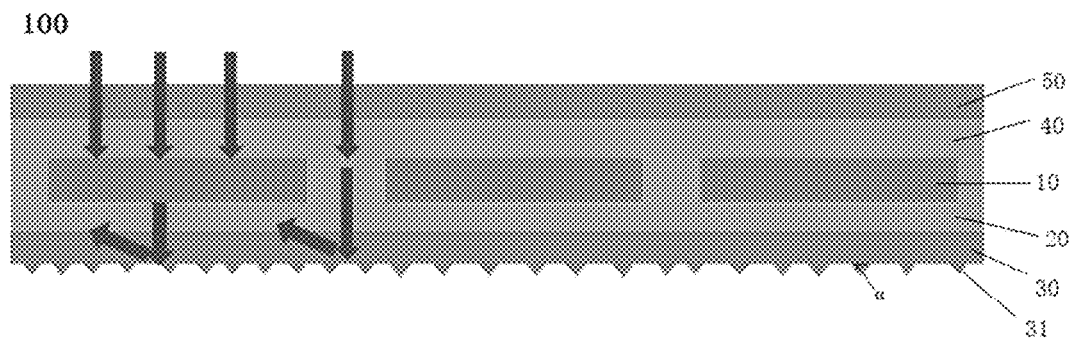
FIG. 1 is a schematic diagram showing line transmission of front sunlight through a first embossing structure according to one or more embodiments of the present disclosure.

100: photovoltaic module;
  10: solar cell string;
  20: first encapsulation adhesive film;
  30: back panel;
    31: first embossing structure;
    32: second embossing structure;
  40: second encapsulation adhesive film;
  50: front panel;
  60: air side;
  70: solar cell.

DESCRIPTION OF EMBODIMENTS

In order to better understand the technical solution of the present disclosure, embodiments of the present disclosure are described in detail below with reference to the accompanying drawings.

It is to be made clear that the described embodiments are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after it are in an "or" relationship.

It is to be noted that the location terms such as "upper", "lower", "left", and "right" described in the embodiments of the present disclosure are described with reference to the angles shown in the accompanying drawings, and should not be construed as limitations on the embodiments of the present disclosure. In addition, in the context, it is to be further understood that, when one element is referred to as being connected "above" or "below" another element, the one element may be directly connected "above" or "below" the another element, or connected "above" or "below" the another element via an intermediate element.

It is to be noted that the steps shown in a flowchart of the accompanying drawings may be performed, for example, in a computer system with a group of computer executable instructions. In addition, although a logical sequence is shown in the flowchart, the sequence of the steps of each embodiment is not limited to the sequence arranged in this specification. In some cases, the implementation steps may be adjusted according to specific requirements, and the steps shown or described are performed in a different order than the sequence shown herein.

Existing photovoltaic modules 100 mainly include a double-glass photovoltaic module 100 and a single-glass photovoltaic module 100 according to cover plate materials used. A double-glass photovoltaic module 100 sequentially includes, from top to bottom, a front plate glass, a front encapsulation adhesive film, a solar cell, a solder strip, a frame, a back plate glass, and a junction box. The front plate glass is generally coated with a rolled glass with light transmittance of typically 94%. Since less light is incident on the rear surface, and coating may increase the cost to some extent, an ordinary rolled glass is adopted on the rear surface. An embossed shape is generally adopted on a contact side of the rolled glass in contact with a back encapsulation adhesive film. A current shape is generally regular hexagonal. The regular hexagonal pattern increases a contact area between the rolled glass and the encapsulation adhesive film, so as to improve bonding force between the rolled glass and the encapsulation adhesive film. However, when facing the light coming from a gap of solar cells or a gap of solar cell strings of the photovoltaic module 100, the existing rolled glass cannot well reflect the light on the solar cell for utilization, which loses certain photovoltaic utilization efficiency. In addition, part of the sunlight is directly incident to the ground, and a very small part of the light incident to the ground is reflected towards the photovoltaic module 100, so that rear power of the photovoltaic module 100 cannot be effectively improved.

In order to improve the utilization of light, a gap film application technology is generally adopted in the related art. However, the gap film application technology may result in an increase in the cost. Moreover, a manufacturing process for the gap film application technology is not mature, resulting in limited applications thereof.

Figure 2:
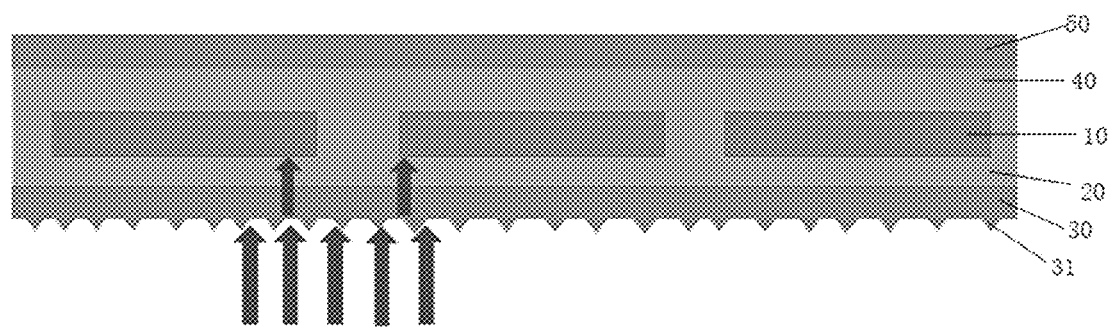
FIG. 2 is a schematic diagram showing line transmission of rear sunlight through the first embossing structure according to one or more embodiments of the present disclosure.

Thus, in order to overcome the imperfections of the related art, according to some embodiments of the present disclosure, a photovoltaic module 100 is provided, as shown in FIG. 1 and FIG. 2, so as to form first embossing structures at a certain angle on one side of a back panel 30 of the photovoltaic module 100 away from an adhesive film, which can effectively utilize gap light and light reflected by the ground, thereby effectively improving front power and rear power of the photovoltaic module 100.

According to some embodiments of the present disclosure, a photovoltaic module 100 is provided, including: a plurality of solar cell strings 10 arranged at intervals and each including a front surface and a rear surface arranged opposite to each other, a first encapsulation adhesive film 20 and a back panel 30 located on the rear surface of the solar cell strings 10, and first embossing structures 31 arranged on one side of the back panel 30 away from the first encapsulation adhesive film 20. An angle between a side surface of the first embossing structure 31 and a horizontal plane of the back panel 30 is in a range from 42° to 80°.

In the above solution, the applicant finds that the first embossing structures 31 are arranged on one side (i.e., air side 60) of the back panel 30 away from the first encapsulation adhesive film 20, and an angle α between a side surface of the first embossing structure 31 and a horizontal plane of the back panel 30 ranges from 42° to 80°. As a result, during light irradiation, sunlight is incident through a gap of the photovoltaic module 100, and the sunlight incident through the gap can be reflected to the rear surface of the photovoltaic module 100 after passing through the first embossing structures 31, enabling the light transmitted through the gap to be effectively utilized, thereby improving the front power of the photovoltaic module 100. At the same time, part of the sunlight is directly incident to the ground, reflected by the ground and then refracted and reflected therefrom. The refracted light is incident to the rear surface of the photovoltaic module 100. Due to the existence of the first embossing structures 31, the light reflected by the ground passes through the first embossing structures 31 which can reduce the reflection, so that most of the sunlight passes through the glass and is incident to the solar cell, to increase the transmittance of light, and the sunlight reflected by the ground is fully utilized, thereby improving the rear power of the photovoltaic module 100.

In some embodiments, the back panel 30 is generally made of transparent glass. The transparent back panel 30 can reduce the reflection of light during operation, thus improving the transmittance of light. The first embossing structure 31 is integrated with the back panel 30 through a rolling technology. The first embossing structure 31 is, for example, a protrusion at a particular angle on the back panel 30.

In some embodiments, the first encapsulation adhesive film 20 may be made of at least one of polyolefin elastomer (POE) and ethylene-vinyl acetate copolymer (EVA). The POE includes polyolefin elastomers such as ethylene-octene copolymer, ethylene-butene copolymer, ethylene-hexene copolymer and the like. In an example, ethylene-octene copolymer is used. The adhesive film made of POE has low water permeability, good PID resistance, high resistance and easy preservation. Therefore, power generation efficiency of the photovoltaic module can be improved by use of the adhesive film made of POE. The EVA is a thermosetting hot melt adhesive, which has no viscosity at room temperature. After hot pressing under a condition, EVA is subjected to melt adhesion, crosslinking and curing, and becomes completely transparent. The first encapsulation adhesive film 20 can separate the solar cell from the back panel 30, and can also play a certain role in damping and cushioning, which is conducive to enhancing the structural strength and service life of the photovoltaic module 100.

In some embodiments, the front surface of the solar cell string 10 is a surface facing the sun (i.e., light receiving surface), and the rear surface of the solar cell string 10 is a surface facing away from the sun (i.e., backlight surface).

Figure 3:
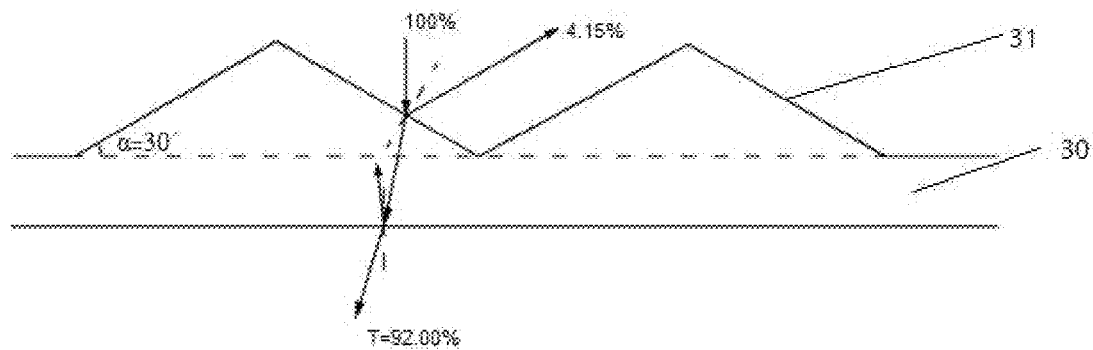
FIG. 3 is a schematic diagram showing line transmission of light reflected from the ground through the first embossing structure when an angle between the first embossing structure and a back panel is 30° according to one or more embodiments of the present disclosure.
Figure 4:
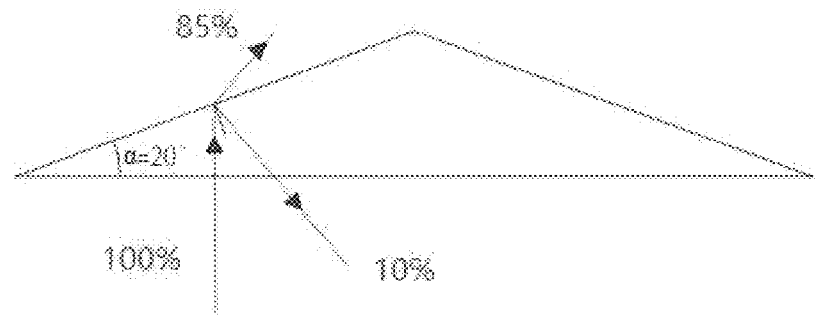
FIG. 4 is a schematic diagram showing line transmission of light transmitted through a gap of the photovoltaic module through the first embossing structure when an angle between the first embossing structure and the back panel is 20° according to one or more embodiments of the present disclosure.
Figure 5:
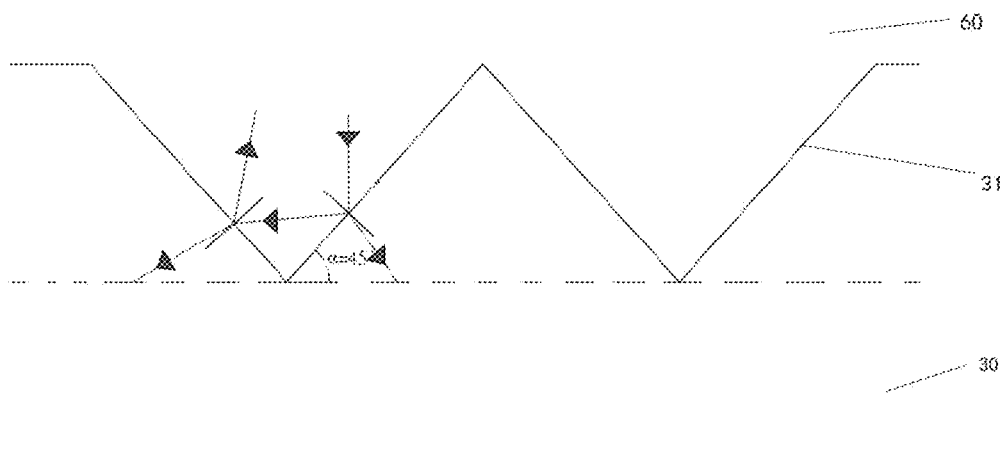
FIG. 5 is a schematic diagram showing line transmission of light reflected from the ground through the first embossing structure when an angle between the first embossing structure and the back panel is 450 according to one or more embodiments of the present disclosure.
Figure 6:
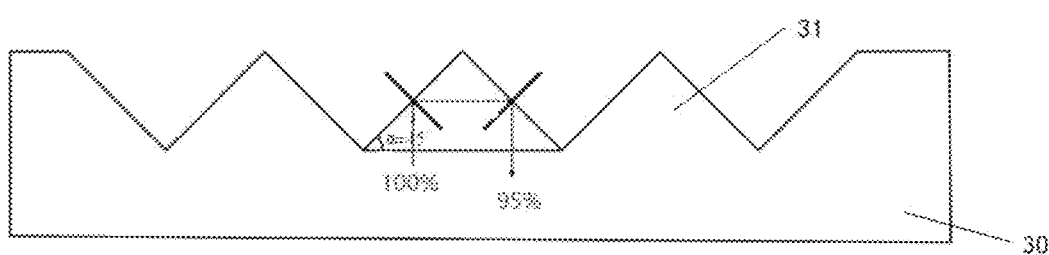
FIG. 6 is a schematic diagram showing line transmission of light transmitted through a gap of the photovoltaic module through the first embossing structure when an angle between the first embossing structure and the back panel is 45° according to one or more embodiments of the present disclosure.

In some embodiments, the angle α between the side surface of the first embossing structure 31 and the horizontal plane of the back panel 30 may be, for example, 42°, 45°, 47°, 48°, 49°, 50°, 53°, 55°, 59°, 60°, 65°, 71°, 75° 78° or 80°. When α is less than 42°, a critical angle of total reflection between glass and air is not reached, and less light is reflected. As shown in FIG. 3, when the angle between the side surface of the first embossing structure 31 and the horizontal plane of the back panel 30 is 30°, sunlight reflected from the ground may partially escape after passing through the first embossing structure, and thus the sunlight is not effectively utilized. As shown in FIG. 4, when the angle α between the side surface of the first embossing structure 31 and the horizontal plane of the back panel 30 is 20°, after sunlight is transmitted through the gap and passes through the first embossing structure, most of the sunlight may partially escape, and a utilization rate of the sunlight may be greatly reduced. When α is greater than 80°, a light trap structure is formed, and after multiple times of total reflection, less light eventually returns to the rear surface of the solar cell. Therefore, in order to increase the utilization rate of sunlight, in the present disclosure, the angle α between the side surface of the first embossing structure 31 and the horizontal plane of the back panel 30 is defined in a range from 42° to 80°. As shown in FIG. 1, a plurality of first embossing structure 31 are arranged on the back panel 30. In the defined range of the angle α in the present disclosure, sunlight passes through the first embossing structures, and may be reflected and/or refracted multiple times on adjacent embossing structures, thereby enhancing the absorption of light. FIG. 5 and FIG. 6 are diagrams of a light transmission path when the angle α is 45°. As shown in FIG. 5, sunlight reflected from the ground passes through the first embossing structure 31 and then is reflected and refracted, and the refracted light is directly incident on the photovoltaic module. The reflected light may be incident on adjacent first embossing structures, then subjected to multiple times of reflection and refraction, and finally incident on the photovoltaic module, thereby increasing the utilization rate of the sunlight. As shown in FIG. 6, after passing through the first embossing structure 31, sunlight transmitted through the gap of the photovoltaic module is subjected to multiple times of reflection and then incident on the photovoltaic module, and the utilization rate of the sunlight can reach 95%.

In some embodiments, to enable front light and rear light to be highly utilized, the angle α between the side surface of the first embossing structure 31 and the horizontal plane of the back panel 30 ranges from 47° to 50°.

In some embodiments, the angle α between the side surface of the first embossing structure 31 and the horizontal plane of the back panel 30 ranges from 42° to 80°. When sunlight is transmitted through the gap of the photovoltaic module (a gap between adjacent solar cell strings and/or a gap between adjacent solar cells) and subjected to multiple times of reflection through the first embossing structure 31, the angle finally reflected has an angle less than 36°, so as to enable the light transmitted through the gap of the photovoltaic module to be reflected to the rear surface of the photovoltaic module for utilization.

In some embodiments, when the angle α between the side surface of the first embossing structure 31 and the horizontal plane of the back panel 30 ranges from 42° to 80°, in consideration of a width of the gap between solar cell strings, sunlight is transmitted through the gap between adjacent solar cell strings and subjected to multiple times of reflection through the first embossing structure 31, an angle β between the light finally reflected and a sidewall of the solar cell string meets the following relation:

$$0<\beta\leq\arctan(D_1/L) \quad (1),$$

where $D_1$ denotes a distance of the gap between adjacent solar cell strings 10, and L denotes a sum of thicknesses of the first encapsulation adhesive film 20 and the back panel 30.

Figure 7:
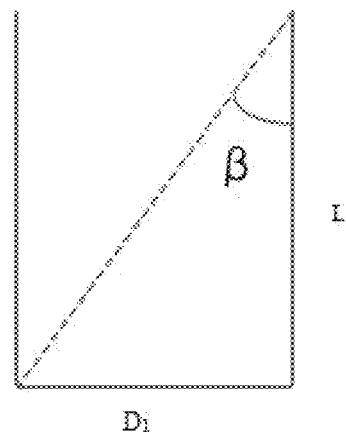
FIG. 7 is a schematic diagram showing an angle after a gap distance between solar cell strings, a back panel, and a first encapsulation adhesive film are taken into account according to one or more embodiments of the present disclosure.
Figure 8:
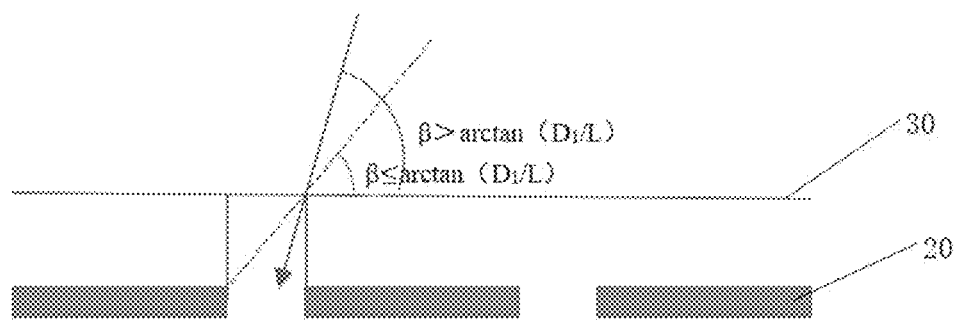
FIG. 8 is a schematic diagram showing light transmission of light escape after a gap distance between solar cell strings, a back panel, and a first encapsulation adhesive film are taken into account according to one or more embodiments of the present disclosure.

As shown in FIG. 7, arctan $(D_1/L)$ denotes a critical angle at which a sunlight reflection path finally reaches the solar cell string. When the critical angle meets the formula (1), it is guaranteed that, when the light reaches glass of the back panel 30 through the gap between the solar cell strings, the light is reflected from an interface between the glass of the back panel 30 and the air back to the rear surface of the solar cell for full utilization. Since the back panel 30 and the first encapsulation adhesive film 20 are made of transparent materials, the light may be reflected to the solar through the back panel 30 for full utilization, and the light may also be reflected to the solar cell through the first encapsulation adhesive film 20 for utilization. When β>arctan $(D_1/L)$, as shown in FIG. 8, gap light between adjacent solar cell strings 10 cannot be incident to the solar cell strings 10 after being reflected by the first embossing structure 31, resulting in escape of the light and ineffective utilization of the light, and thus leading to low power of the photovoltaic module 100.

Figure 9:
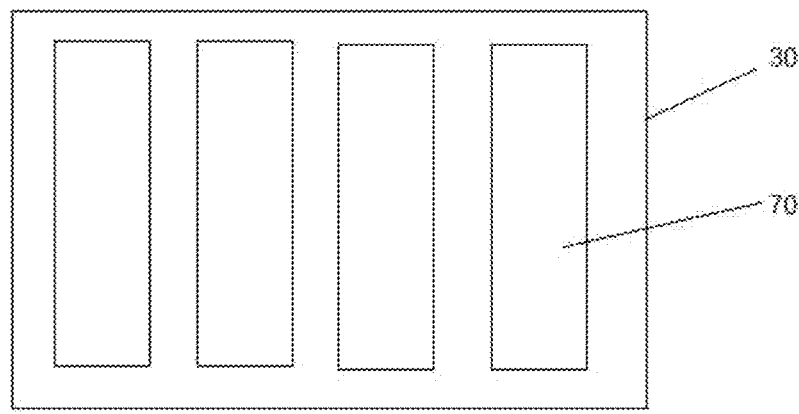
FIG. 9 is a schematic structural diagram of a solar cell string composed of a plurality of solar cells.

In some embodiments, as shown in FIG. 9, the solar cell string 10 includes a plurality of solar cells 70 connected in series or in parallel, and a gap exists between two adjacent solar cells 70. A gap may also exist between two adjacent solar cell strings 10. That is, the gap of the photovoltaic module 100 includes the gap between two adjacent solar cells and/or the gap between two adjacent solar cell strings 10.

In some embodiments, based on the same situation, when the angle α between the side surface of the first embossing structure 31 and the horizontal plane of the back panel 30 ranges from 42° to 80°, in consideration of a width of the gap between solar cell strings 70, sunlight is transmitted through the gap between adjacent solar cell strings 70 and subjected to multiple times of reflection through the first embossing structure 31, an angle γ between the light finally reflected and a sidewall of the solar cell meets the following relation:

$$0<\gamma\leq\arctan(D_2/L) \quad (2),$$

where $D_2$ denotes a distance of the gap between adjacent solar cells 70.

Figure 10:
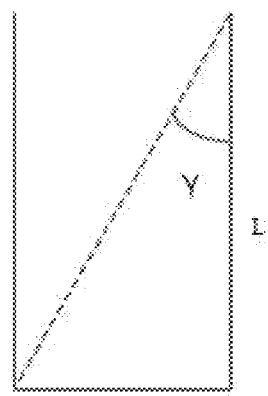
FIG. 10 is a schematic diagram showing an angle after a gap distance between solar cells, a back panel, and a first encapsulation adhesive film are taken into account according to one or more embodiments of the present disclosure.

As shown in FIG. 10, arctan $(D_2/L)$ denotes a critical angle at which a sunlight reflection path finally reaches the solar cell. When the critical angle meets the formula (2), it is guaranteed that, when the light reaches glass of the back panel 30 through the gap between the solar cells, the light is reflected from an interface between the glass of the back panel 30 and the air back to the rear surface of the solar cell for full utilization. Since the back panel 30 and the first encapsulation adhesive film 20 are made of transparent materials, the light may be reflected to the solar cell through the back panel 30 for utilization, and the light may also be reflected to the solar cell through the first encapsulation adhesive film 20 for utilization.

The critical angle R and the critical angle γ are required to meet the formula (1) and the formula (2), and thus can increase front power of the photovoltaic module 100. In consider of the fact that the distance $D_1$ between the solar cell strings 10 is larger than the distance $D_2$ between the solar cells, that is, the gap between the solar cell strings 10 is larger and more gap light exists, it is preferred that the angle between the first embossing structure 31 and the back panel 30 meets the formula (1).

In some embodiments, the first embossing structure 31 has a depth ranging from 10 μm to 100 μm. The first embossing structure 31 is a protrusion provided on the side of the back panel 30 away from the first encapsulation adhesive film 20. The depth of the first embossing structure 31 may be, for example, 10 μm, 20 μm, 30 μm, 42 μm, 50 μm, 60 μm, 70 μm, 80 μm, 90 μm or 100 μm. In the above defined range, the reflection effect of light can be improved, and dust accumulation is prevented, so as to improve the utilization rate of sunlight.

Figure 11:
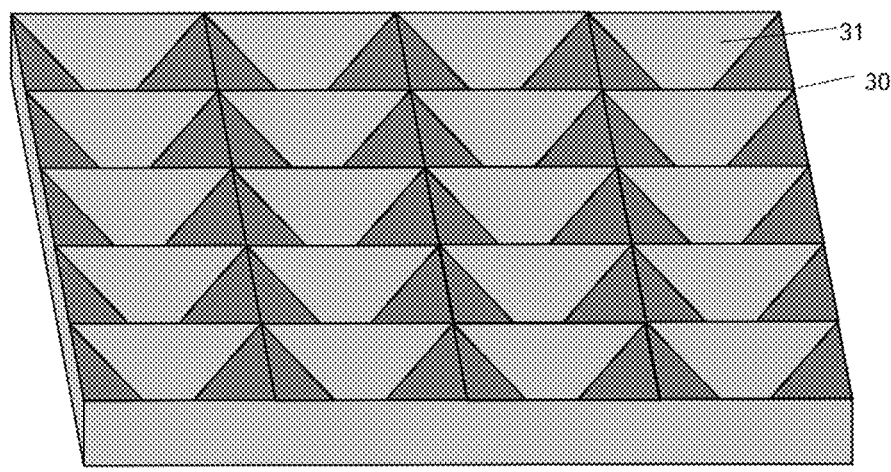
FIG. 11 is a schematic structural diagram of first embossing structures arranged in rows and columns according to one or more embodiments of the present disclosure.

In some embodiments, the first embossing structures 31 are arranged periodically on the back panel 30. In an example, the first embossing structures 31 may be arranged in rows and columns on the back panel 30. Referring to the schematic structural diagram of the back panel on which the first embossing structures are arranged in rows and columns in FIG. 11. Alternatively, the first embossing structures 31 may be misaligned in rows and columns, so that the first embossing structures 31 on the back panel 30 show certain regularity, and more first embossing structures 31 can be arranged on the back panel 30, so as to use more sunlight.

Figure 12:
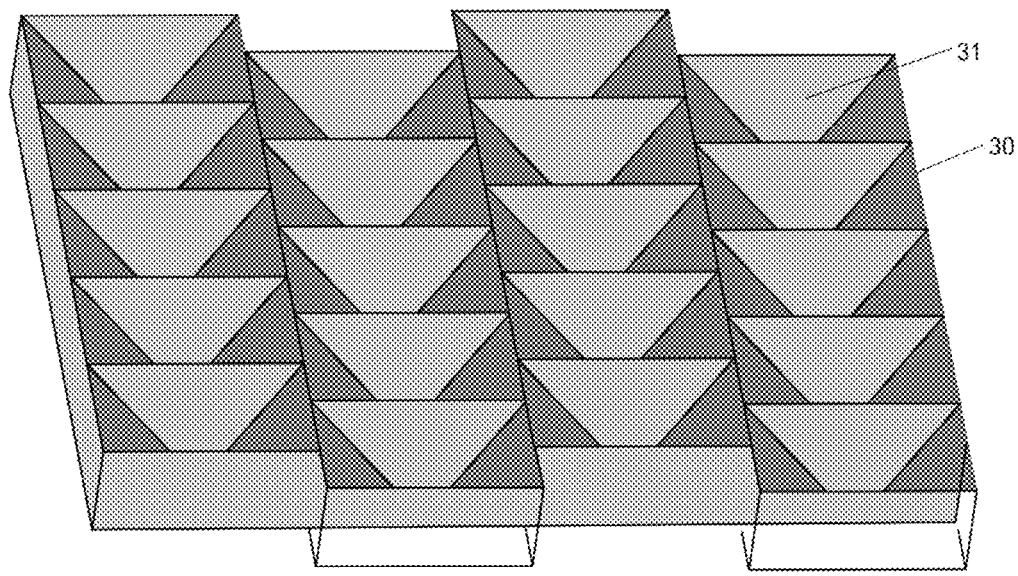
FIG. 12 is a schematic structural diagram of first embossing structures misaligned in columns according to one or more embodiments of the present disclosure.

In some embodiments, the photovoltaic module 100 is arranged outdoors for operation, and the sunlight does not shine vertically all day. Therefore, the first embossing structures 31 are misaligned on the back panel 30 to enhance incoming light. The first embossing structures 31 may be misaligned in rows on the back panel 30, and the first embossing structures 31 may also be misaligned in columns on the back panel 30. FIG. 12 is a schematic structural diagram of a back panel on which first embossing structures are misaligned in columns.

Figure 13:
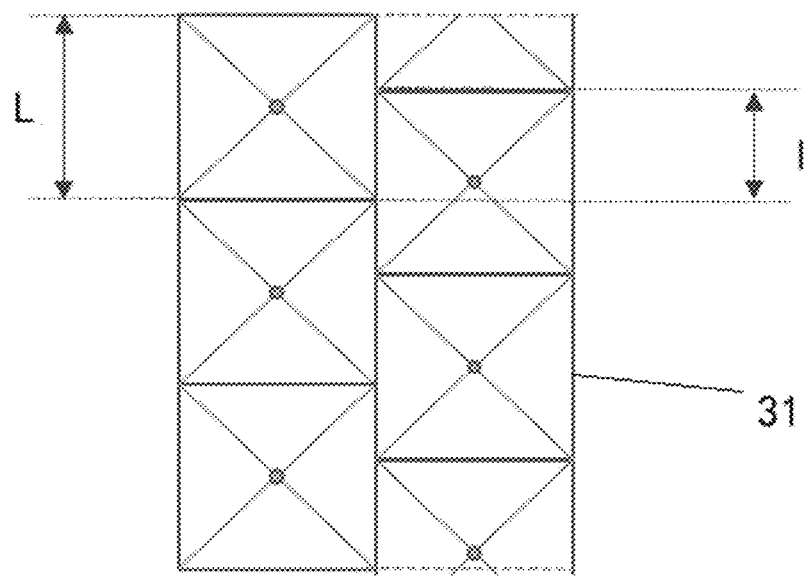
FIG. 13 is a test chart of a misalignment rate of the first embossing structures misaligned in columns according to one or more embodiments of the present disclosure.

In some embodiments, a misalignment rate of the first embossing structures 31 is 30% to 70%. In an example, when the first embossing structures 31 are misaligned in columns, as shown in FIG. 13, the depth of the first embossing structures 31 is L, and an overlap depth of the first embossing structures 31 in adjacent columns (i.e., a length after the first embossing structures 31 in adjacent columns overlap) is 1, where 1=L*(30%–70%). For example, 1 may be 0.3 L, 0.4 L, 0.5 L, 0.6 L or 0.7 L. When the misalignment rate of the first embossing structures 31 is less than 30%, fewer first embossing structures 31 are arranged, and thus less sunlight is utilized. When the misalignment rate of the first embossing structures 31 is greater than 70%, part of the sunlight easily escapes from adjacent interfaces of the first embossing structures 31 when reflected. Similarly, when the first embossing structures 31 are misaligned in rows, an overlap length of the first embossing structures 31 in adjacent rows is 30% to 70% of the length of the first embossing structures 31. The overlap length of the first embossing structures 31 in adjacent rows may be 30%, 42%, 50%, 60% or 70% of the length of the first embossing structures 31. In the present disclosure, the misalignment rate of the first embossing structures 31 is controlled within the above range, so that more light can be incident to the glass of the back panel 30, reducing the number of times of refraction and reflection between the glass of the back panel 30 and the air.

In some embodiments, a shape of the first embossing structure 31 includes at least one of a polygonal cone shape and an arc-surface pit shape. The first embossing structure 31 in the polygonal cone shape and/or the arc-surface pit shape may reflect and refract more sunlight, helping to increase the utilization rate of the sunlight. The first embossing structure 31 according to the present disclosure may be engraved by a press roller to form the polygonal cone shape and/or the arc-surface pit shape according to the present disclosure. The back panel 30 with the first embossing structures 31 may be formed by rapid cooling of a glass liquid through the press roller. For example, the back panel 30 with the first embossing structures 31 may also be formed by laser engraving.

In some embodiments, the embossing structure in the polygonal cone shape may be a structure in a normal cone shape or an inverted cone shape. In an example, the structure in the inverted cone shape is used, which can reduce scratches caused by contact between the glass during the manufacturing of the back panel 30.

In some embodiments, the first embossing structure 31 is a protrusion arranged on the back panel 30, and a projection thereof on the back panel 30 is in the shape of a polygon or an arc.

In some embodiments, the polygonal cone shape may be a circular cone shape or a pyramid shape. The polygonal pyramid shape includes at least one of a triangular pyramid, a quadrilateral pyramid, a pentagonal pyramid, a hexagonal pyramid, and an octagonal pyramid. The polygonal circular cone shape includes at least one of a triangular circular cone, a quadrilateral circular cone, a pentagonal circular cone, a hexagonal circular cone, and an octagonal circular cone. In an example, the polygonal cone shape may be an inverted triangular pyramid, that is, an inverted pyramid structure.

In some embodiments, when sunlight passes through the first embossing structure 31, light is reflected and refracted mainly by using a plane of an edge of the polygonal pyramid, so that part of the light is directly reflected to the solar cell, thereby increasing the utilization rate of the sunlight and improving front power of the photovoltaic module 100. The light may also be reflected by using an arc surface in the arc-surface pit shape, so that part of the light is directly reflected to the solar cell, thereby increasing the utilization rate of the sunlight.

In some embodiments, in the present disclosure, the arrangement of the first embossing structure 31 can increase the utilization rate of sunlight incident from the front surface of the photovoltaic module 100 and the utilization rate of sunlight incident from the rear surface of the photovoltaic module 100.

For a double-sided double-glass photovoltaic module, the existence of particular first embossing structures 31 can increase the transmittance of light, and light transmitted through the gap of the photovoltaic module 100 may be reflected to the rear surface of the photovoltaic module 100 via the first embossing structures 31, thereby improving the front power of the photovoltaic module 100. At the same time, since the first embossing structures 31 are provided on the side of the back panel 30 away from the first encapsulation adhesive film 20, that is, located on the air side 60 of the rear surface of the photovoltaic module 100, reflection of the sunlight reflected from the ground is reduced on an interface between the glass of the first embossing structures 31 and the air, and the amount of sunlight incident on the rear surface of the photovoltaic module 100 increases, thereby improving the rear power of the photovoltaic module 100.

For a single-sided double-glass photovoltaic module 100, the particular first embossing structures 31 can increase the transmittance of light, and light transmitted through the gap of the photovoltaic module 100 may be reflected to the rear surface of the photovoltaic module 100 via the first embossing structures 31, so that the rear power of the photovoltaic module 100 can be improved with almost no additional cost.

Based on the above, in the present disclosure, the first embossing structures 31 with directional reflection and refraction are designed on the side of the back panel 30 away from the first encapsulation adhesive film 20, which can target regions where front light may escape (e.g., gaps between solar cell strings 10 and gaps between solar cells), and increase the utilization rate of the front light, thereby improving the front power of the photovoltaic module 100. At the same time, since the first embossing structures 31 are arranged on the air side 60 of the rear surface of the photovoltaic module 100, the light reflected by the ground can be reflected and refracted multiple times on the back panel 30 and finally incident on the photovoltaic module 100, thereby improving the rear power of the photovoltaic module 100. In the present disclosure, in conjunction with an actual situation of the module and the manufacturing of the glass by glass manufacturers, characteristics of angle, arrangement, and pattern depth are considered for the design of the first embossing structure. Only the pattern of the back panel 30 is changed finally, so that the front power of the photovoltaic module is increased by 1.6%, the rear power of the photovoltaic module is increased by 4.7%, and double-sided power gain of the photovoltaic module is increased by 2.7%.

In some embodiments, the back panel 30 is connected to the first encapsulation adhesive film 20, and if embossing structures are arranged on the side of the back panel connected to the first encapsulation adhesive film, the embossing structures may be filled with the adhesive film, resulting in a waste of the first encapsulation adhesive film. Therefore, the side of the back panel 30 close to the first encapsulation adhesive film 20 is set smooth, and a smooth side surface of the back panel 30 is connected to the solar cell string through the first encapsulation adhesive film 20.

In some embodiments, the back panel 30 is bonded to the rear surface of the solar cell string 10 through the first encapsulation adhesive film 20. In order to enhance the adhesion of the back panel 30 and the solar cell string 10, in the present disclosure, the side of the back panel 30 close to the first encapsulation adhesive film 20 is provided with second embossing structures 32. The arrangement of the second embossing structures 32 leads to an increase in a contact area between the back panel 30 and the first encapsulation adhesive film 20, thereby enhancing the adhesion of the back panel 30 and the solar cell string 10. The arrangement of the second embossing structures 32 also enables the sunlight to shine on the second embossing structures 32 and to be reflected to the solar cell string 10, so as to improve the power of the photovoltaic module 100.

Figure 14:
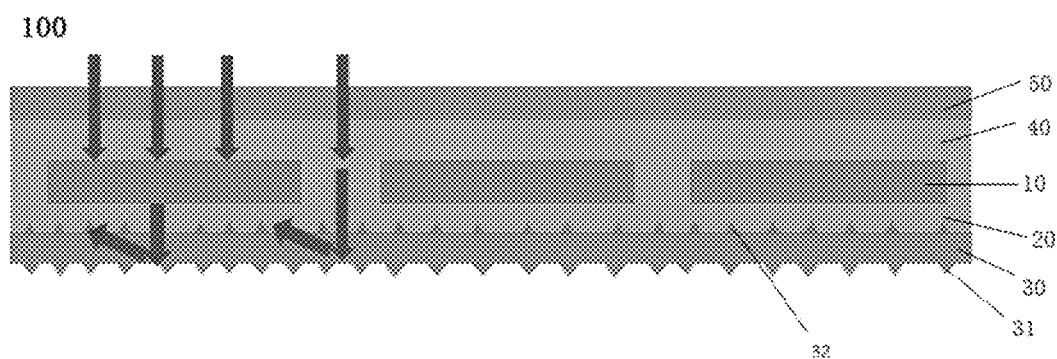
FIG. 14 is a schematic structural diagram of a photovoltaic module with second embossing structures according to one or more embodiments of the present disclosure.

In some embodiments, as shown in FIG. 14, the side of the back panel 30 close to the first encapsulation adhesive film 20 is provided with second embossing structures 32. A setting angle and arrangement of the second embossing structures 32 may be the same as those of the first embossing structures 31.

In some embodiments, the second embossing structures 32 are in direct contact with the first encapsulation adhesive film 20, and in order to prevent the influence on the adhesion of the first encapsulation adhesive film 20, a depth of the second embossing structures 32 is less than the first embossing structures 31 in the present disclosure. The greater the depth of the second embossing structures 32 on the back panel 30, the more difficult the manufacturing, and the more the first encapsulation adhesive film 20 with which the embossing structures are filled. Therefore, the depth of the second embossing structures 32 defined in the present disclosure can improve reflection efficiency of the front light while reducing costs, thereby improving the overall performance of the photovoltaic module 100.

In some embodiments, the second embossing structure 32 has a depth ranging from 20 μm to 80 μm.

In an example, the depth of the second embossing structure 32 may be 20 μm, 30 μm, 40 μm, 50 μm, 60 μm, 70 μm or 80 μm.

Based on the above, in the present disclosure, embossing structures are designed respectively on two sides of the back panel 30 inside the photovoltaic module 100, which can increase the utilization rate of the sunlight, improve front power and rear power of the photovoltaic module 100, and improve the overall performance of the photovoltaic module 100.

In some embodiments, the photovoltaic module 100 further includes a front panel 50 and a second encapsulation adhesive film 40 that are located on the front surface of the photovoltaic module 100.

The front panel 50 is generally made of transparent coated glass. The front panel 50 generally has a thickness ranging from 3.2 mm to 10 mm, and the light transmittance thereof is required to be above 90%.

In some embodiments, the second encapsulation adhesive film 40 may be made of at least one of POE and EVA. POE includes polyolefin elastomers such as ethylene-octene copolymer, ethylene-butene copolymer and ethylene-hexene copolymer. In an example, ethylene-octene copolymer is used. The adhesive film made of POE has low water permeability, good PID resistance, high resistance and easy preservation. Therefore, power generation efficiency of the photovoltaic module can be improved by use of the adhesive film made of POE. EVA is a thermosetting hot melt adhesive, which has no viscosity at room temperature. After hot pressing under a certain condition, EVA is subjected to melt adhesion, crosslinking and curing, and becomes completely transparent. The second encapsulation adhesive film 40 can separate the solar cell from the back panel 30, and can also play a certain role in damping and cushioning, which is conducive to enhancing the structural strength and service life of the photovoltaic module 100.

In some embodiments, the photovoltaic module 100 further includes a frame. The frame may be made of aluminum alloy or stainless steel. When aluminum alloy is selected for forming the frame, the strength and corrosion resistance of the frame are good. The frame may support and protect the entire solar panel. The photovoltaic module 100 may also be connected to an external photovoltaic bracket through the frame. A plurality of photovoltaic modules 100 may be connected to each other to form a photovoltaic power station.

In some embodiments, the photovoltaic module 100 further includes a junction box. After positive and negative poles of a solar cell module are extracted from the back, a special electrical connection box is required so as to realize connection with an external circuit. The junction box may also protect the power generation system of the entire solar panel, which is equivalent to a current transfer station. When a solar cell is short-circuited, the short-circuited solar cell string may be automatically disconnected by using the junction box.

In any one of the above embodiments, the solar cell may be any one of a conventional monocrystalline cell, a passivated emitter and rear cell (PERC), a TOPCon solar cell, and a heterojunction (HJT) solar cell. Compared with conventional solar cells, the PERC shows a good efficiency advantage, which can increase the industrial efficiency by 1% to 1.5% than the conventional solar cells. The TOPCon or HJT solar cell is an N-type crystalline silicon high-efficiency cell, and theoretical efficiency thereof may reach more than 28%. The TOPCon or HJT solar cell is a currently popular high-efficiency silicon-based solar cell scheme. The conventional monocrystalline cell, the PERC monocrystalline cell, the TOPCon solar cell and the HJT solar cell all have good characteristics of converting light energy into electric energy, and can well improve conversion efficiency of the light energy of the solar cell, thereby increasing the utilization rate of the light energy of the solar cell. That is, the conventional monocrystalline cell, the PERC monocrystalline cell, the TOPCon solar cell and the HJT solar cell all have good characteristics of converting light energy into electric energy, and can well improve conversion efficiency of the light energy of the solar cell, thereby increasing the utilization rate of the light energy.

Examples of the solar cell are provided below.

A solar cell includes: a semiconductor substrate, the semiconductor substrate including a front surface and a rear surface; an emitter, a front passivation layer and/or an anti-reflection layer sequentially located on the front surface of the semiconductor substrate; a conductive layer and a rear passivation layer located on the rear surface of the semiconductor substrate; a front electrode in contact with the emitter, the front electrode passing through the front passivation layer to form ohmic contact with the emitter; and a rear electrode in contact with the conductive layer, the rear electrode passing through the rear passivation layer to form ohmic contact with the conductive layer.

The front surface of the semiconductor substrate may refer to a light receiving surface, that is, a surface receiving sunlight. The rear surface of the semiconductor substrate may refer to a surface opposite to the front surface. In some embodiments, the solar cell formed is a single-sided solar cell, the front surface may refer to the light receiving surface, and the rear surface may refer to a backlight surface. In some embodiments, the solar cell formed is a double-sided solar cell, and the front surface and the rear surface may both be light receiving surfaces.

In some embodiments, the semiconductor substrate is an N-type crystalline silicon substrate (or silicon wafer). A P-type doping layer may be formed on the front surface of the semiconductor substrate by any one or more processes of high-temperature diffusion, paste doping and ion implantation, so as to form a PN junction in the semiconductor substrate. In some embodiments, the semiconductor substrate may be one of a monocrystalline silicon substrate, a polycrystalline silicon substrate, a microcrystalline silicon substrate, or a silicon carbide substrate.

In some embodiments, the front surface of the semiconductor substrate has a texture structure. The texture structure includes a pyramidal microstructure. The pyramidal microstructure may be, for example, a tetrahedron, a substantial tetrahedron, a pentahedron, or substantial pentahedron structure. The pyramidal microstructure may be formed by texturing the semiconductor substrate. The texturing may be, for example, chemical etching, laser etching, mechanical process, or plasma etching. The pyramidal microstructure enables better filling when metal paste forms an electrode by screen printing, so as to obtain excellent electrode contact, which can effectively reduce series resistance of the solar cell and increase the filling factor.

In some embodiments, the front passivation layer includes a stacked structure of at least one or more of a silicon oxide layer, a silicon nitride layer, an aluminium oxide layer, or a silicon oxynitride layer.

In some embodiments, the front passivation layer has a thickness in a range from 10 nm to 120 nm, which may be, for example, 10 nm, 20 nm, 30 nm, 42 nm, 50 nm, 60 nm, 70 nm, 80 nm, 90 nm, 100 nm or 120 nm, and may also be other values in the range, which is not limited herein.

Further, the rear surface of the semiconductor substrate may also has a texture structure. The texture structures of the front surface and the rear surface may be identical or different. Arrangement of texture structures in different shapes on the front surface and the rear surface of the semiconductor substrate, i.e., the formation of a pyramidal texture structure on the front surface and a non-pyramid texture structure on the rear surface, enables the formed solar cell to have a light trap structure at different levels, thereby increasing an effective contact area of light.

In some embodiments, the conductive layer may be a doped polysilicon layer, a doped microcrystalline silicon layer, or a doped amorphous silicon layer. The doped conductive layer has a doped element of a same conductivity type as the semiconductor substrate.

When the semiconductor substrate is an N-type monocrystalline silicon substrate, the doped conductive layer is an N-type doped polysilicon layer, an N-type doped microcrystalline silicon layer, or an N-type doped amorphous silicon layer. The doped element may be an N-type doping element such as phosphorus.

In some embodiments, the rear passivation layer includes at least one or more of a silicon nitride layer, a silicon oxide layer, or a silicon oxynitride layer. The second passivation layer has a thickness ranging from 70 nm to 120 nm.

In some embodiments, when the rear passivation layer is stacked with a silicon nitride layer and a silicon oxide layer, or stacked with a silicon nitride layer and a silicon oxynitride layer, the silicon nitride layer is located on a surface of the doped conductive layer, and the silicon oxide layer or the silicon oxynitride layer is located on a surface of the silicon nitride layer.

In some embodiments, the front electrode and the rear electrode may be formed by sintering metal conductive paste coated on surfaces of the front passivation layer and the rear passivation layer. In some embodiments, the front electrode or the rear electrode may be made of a metal material such as silver, aluminum, copper, or nickel.

In some embodiments, the present disclosure further provides a back panel. The back panel is the back panel 30 described in the above photovoltaic module. In an example, at least one side of the back panel 30 is provided with first embossing structures 31, and an angle between a side surface of the first embossing structure 31 and a horizontal plane of the back panel 30 ranges from 42° to 80°. The first embossing structure 31 is integrated with the back panel 30 through a rolling technology. The first embossing structure 31 is, for example, a protrusion at a certain angle on the back panel 30.

The angle α between the side surface of the first embossing structure 31 and the horizontal plane of the back panel 30 may be, for example, 42°, 45°, 47°, 48°, 49°, 50°, 53°, 55°, 59°, 60°, 65°, 71°, 75°, 780 or 80°. In an example, the angle α between the side surface of the first embossing structure 31 and the horizontal plane of the back panel 30 ranges from 47° to 50°.

In some embodiments, the first embossing structure 31 has a depth ranging from 10 μm to 100 μm. The first embossing structure 31 is a protrusion arranged on at least one side. The depth of the first embossing structure 31 may be, for example, 10 μm, 20 μm, 30 μm, 42 μm, 50 μm, 60 μm, 70 μm, 80 μm, 90 μm or 100 μm.

In some embodiments, the first embossing structures 31 are arranged periodically on the back panel 30.

In some embodiments, the first embossing structures 31 are misaligned on the back panel 30, and a misalignment rate of the first embossing structures 31 is in a range from 30% to 70%. In an example, the misalignment rate of the first embossing structures 31 may be 30%, 40%, 50%, 60% or 70%.

In some embodiments, a shape of the first embossing structure 31 includes at least one of a polygonal cone shape and an arc-surface pit shape. The polygonal cone shape may be a circular cone shape or a pyramid shape. The polygonal pyramid shape includes at least one of a triangular pyramid, a quadrilateral pyramid, a pentagonal pyramid, a hexagonal pyramid, or an octagonal pyramid. The polygonal circular cone shape includes at least one of a triangular circular cone, a quadrilateral circular cone, a pentagonal circular cone, a hexagonal circular cone, or an octagonal circular cone. In an example, the polygonal cone shape may be an inverted triangular pyramid, that is, an inverted pyramid structure.

The photovoltaic module in the present disclosure is further described below according to specific embodiments.

Photovoltaic modules in Embodiments 1-12 and Comparative Examples 1-3 are all manufactured according to parameters in Table 1 below, and front power and rear power of the photovoltaic modules are measured.

TABLE 1

Photovoltaic modules in embodiments and comparative examples

| Category | Shape of first embossing structure | Angle α of first embossing structure | Depth (μm) of first embossing structure | Misalignment rate (%) of first embossing structure | Rear surface of photovoltaic module Current (mA) | Rear surface of photovoltaic module Power gain (%) | Front surface of photovoltaic module Current (mA) | Front surface of photovoltaic module Power gain (%) | Double-sided power gain (%) of photovoltaic module |
|---|---|---|---|---|---|---|---|---|---|
| Embodiment 1 | Inverted pyramid | 42° | 50 | 60% | 6.607 | 0.55% | 5.765 | 3.13% | 87.26% |
| Embodiment 2 | Inverted pyramid | 43° | 50 | 60% | 6.599 | 0.43% | 5.805 | 3.85% | 87.97% |
| Embodiment 3 | Inverted pyramid | 44° | 50 | 60% | 6.583 | 0.18% | 5.828 | 4.26% | 88.53% |
| Embodiment 4 | Inverted pyramid | 45° | 50 | 60% | 6.577 | 0.09% | 5.86 | 4.83% | 89.10% |
| Embodiment 5 | Inverted pyramid | 46° | 50 | 60% | 6.598 | 0.41% | 5.851 | 4.67% | 88.68% |
| Embodiment 6 | Inverted pyramid | 47° | 50 | 60% | 6.673 | 1.55% | 5.849 | 4.63% | 87.65% |
| Embodiment 7 | Inverted pyramid | 48° | 50 | 60% | 6.674 | 1.57% | 5.855 | 4.74% | 87.73% |
| Embodiment 8 | Inverted pyramid | 49° | 50 | 60% | 6.667 | 1.46% | 5.844 | 4.54% | 87.66% |

TABLE 1-continued

Photovoltaic modules in embodiments and comparative examples

| Category | Shape of first embossing structure | Angle α of first embossing structure | Depth (μm) of first embossing structure | Misalignment rate (%) of first embossing structure | Rear surface of photovoltaic module Current (mA) | Rear surface of photovoltaic module Power gain (%) | Front surface of photovoltaic module Current (mA) | Front surface of photovoltaic module Power gain (%) | Double-sided power gain (%) of photovoltaic module |
|---|---|---|---|---|---|---|---|---|---|
| Embodiment 9 | Inverted pyramid | 50° | 50 | 60% | 6.649 | 1.19% | 5.842 | 4.51% | 87.86% |
| Embodiment 10 | Inverted pyramid | 60° | 50 | 60% | 6.57 | −0.08% | 5.80 | 3.83% | 88.39% |
| Embodiment 11 | Inverted pyramid | 70° | 50 | 60% | 6.57 | −0.08% | 5.85 | 4.56% | 89.02% |
| Embodiment 12 | Inverted pyramid | 80° | 50 | 60% | 6.57 | −0.06% | 5.84 | 4.44% | 88.90% |
| Embodiment 13 | Arc-surface pit shape | 50° | 50 | 60% | 6.251 | 1.15% | 5.84 | 4.49% | 87.80% |
| Comparative Example 1 | Inverted pyramid | 0° | 50 | 60% | 6.57 | 0.00% | 5.59 | 0.00% | 85.07% |
| Comparative Example 2 | Inverted pyramid | 30° | 50 | 60% | 6.57 | −0.05% | 5.60 | 0.09% | 85.19 |
| Comparative Example 3 | Inverted pyramid | 85 | 50 | 60% | 6.55 | −0.06% | 5.60 | 0.09% | 85.17% |

As can be seen from Table 1 above, in the photovoltaic module manufactured according to the present disclosure, an angle α between a side surface of the first embossing structure 31 and a horizontal plane of the back panel 30 ranges from 42° to 80°, so that during light irradiation sunlight is incident through a gap of the photovoltaic module 100, and the sunlight incident through the gap can be reflected to the rear surface of the photovoltaic module 100 after passing through the first embossing structure 31, enabling the light transmitted through the gap to be effectively utilized, thereby improving the front power of the photovoltaic module 100. At the same time, part of the sunlight is directly incident to the ground, reflected by the ground and then refracted and reflected. The refracted light will incident to the rear surface of the photovoltaic module 100. Due to the existence of the first embossing structure 31, the light reflected by the ground passes through the first embossing structure 31, which can reduce the reflection, so that more light is incident to the rear surface of the photovoltaic module to increase utilization rate of the light reflected by the ground, thereby increasing the rear power of the photovoltaic module 100.

The angle α between the first embossing structure 31 and the back panel 30 in Comparative Example 1 to Comparative Example 3 is less than or greater than the range defined in the present disclosure, which may lead to a decrease in the utilization rate of the sunlight passing through the embossing structure, thereby resulting in low front power and rear power of the photovoltaic module 100.

The above are merely some embodiments of the present disclosure, and are not intended to limit the present disclosure. Any modification, equivalent replacement, improvement and the like within the principle of the present disclosure all fall within the protection scope of the present disclosure.

What is claimed is:

1. A photovoltaic module, comprising:
a solar cell string having a front surface and a rear surface arranged opposite to each other;
a first encapsulation adhesive film located on the rear surface of the solar cell string; and
a back panel located on a rear surface of the first encapsulation adhesive film,
wherein the back panel comprises a flat plate and first embossing structures on a rear surface of the flat plate,
each of the first embossing structures is a pyramidal microstructure comprising: a polygonal base on the rear surface of the flat plate, an apex pointing away from the rear surface of the flat plate, and a side surface,
the first embossing structures are exposed to external air, and the front surface of the solar cell string is a light-receiving surface, and
wherein the photovoltaic module further comprises second embossing structures on a front surface of the flat plate, wherein each of the second embossing structures is a pyramidal microstructure comprising: a polygonal base on the front surface of the flat plate, an apex pointing away from the front surface of the flat plate, and a side surface.

2. The photovoltaic module according to claim 1, wherein an angle between the side surface of each first embossing structure and the rear surface of the flat plate ranges from 42° to 80°.

3. The photovoltaic module according to claim 1, wherein a distance between the rear surface of the flat plate and the apex of the pyramidal microstructure in the first embossing structures is greater than a distance between the front surface of the flat plate and the apex of the pyramidal microstructure in the second embossing structures.

4. The photovoltaic module according to claim 1, wherein the second embossing structures are in contact with the first encapsulation adhesive film.

5. The photovoltaic module according to claim 1, wherein the polygonal bases of the first embossing structures are spaced apart from one another.

* * * * *